(12) United States Patent
Loubet et al.

(10) Patent No.: US 12,211,936 B2
(45) Date of Patent: *Jan. 28, 2025

(54) STRAINED-CHANNEL FIN FETS

(71) Applicant: STMICROELECTRONICS, INC., Coppell, TX (US)

(72) Inventors: Nicolas Loubet, Guilderland, NY (US); Pierre Morin, Kessel-Lo (BE)

(73) Assignee: STMICROELECTRONICS, INC., Coppell, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 18/146,962

(22) Filed: Dec. 27, 2022

(65) Prior Publication Data

US 2023/0352586 A1  Nov. 2, 2023

Related U.S. Application Data

(60) Continuation of application No. 17/074,121, filed on Oct. 19, 2020, now Pat. No. 11,569,384, which is a continuation of application No. 16/584,647, filed on Sep. 26, 2019, now Pat. No. 10,847,654, which is a division of application No. 15/798,976, filed on Oct. 31, 2017, now Pat. No. 10,483,393, which is a continuation of application No. 14/975,534, filed on Dec. 18, 2015, now Pat. No. 9,831,342, which is a continuation of application No. 14/597,457, filed on Jan. 15, 2015, now Pat. No. 9,245,953, which is a
(Continued)

(51) Int. Cl.
*H01L 29/78* (2006.01)
*H01L 29/10* (2006.01)
*H01L 29/15* (2006.01)
*H01L 29/16* (2006.01)
*H01L 29/161* (2006.01)
*H01L 29/165* (2006.01)
*H01L 29/66* (2006.01)

(52) U.S. Cl.
CPC ...... *H01L 29/7848* (2013.01); *H01L 29/1054* (2013.01); *H01L 29/155* (2013.01); *H01L 29/16* (2013.01); *H01L 29/1608* (2013.01); *H01L 29/161* (2013.01); *H01L 29/165* (2013.01); *H01L 29/66795* (2013.01); *H01L 29/785* (2013.01); *H01L 29/7851* (2013.01)

(58) Field of Classification Search
CPC . H01L 29/1054; H01L 29/16; H01L 29/1608; H01L 29/161; H01L 29/165; H01L 29/66795; H01L 29/7848; H01L 29/785; H01L 29/7851; H01L 27/0886; H01L 27/0924; H01L 27/10826; H01L 27/10879
USPC ........................................................ 257/308
See application file for complete search history.

(56) References Cited

U.S. PATENT DOCUMENTS

2004/0169239 A1  9/2004 Rim
2005/0145941 A1  7/2005 Bedell et al.
(Continued)

*Primary Examiner* — Hoai V Pham
(74) *Attorney, Agent, or Firm* — Seed IP Law Group LLP

(57) ABSTRACT

Methods and structures for forming strained-channel fin-FETs are described. Fin structures for finFETs may be formed in two epitaxial layers that are grown over a bulk substrate. A first thin epitaxial layer may be cut and used to impart strain to an adjacent channel region of the finFET via elastic relaxation. The structures exhibit a preferred design range for increasing induced strain and uniformity of the strain over the fin height.

18 Claims, 13 Drawing Sheets

Related U.S. Application Data division of application No. 13/953,551, filed on Jul. 29, 2013, now Pat. No. 8,952,420.

(56) References Cited

U.S. PATENT DOCUMENTS

| | | |
|---|---|---|
| 2005/0218438 A1 | 10/2005 | Lindert et al. |
| 2006/0157794 A1 | 7/2006 | Doyle et al. |
| 2006/0180866 A1 | 8/2006 | Zhu et al. |
| 2007/0145483 A1 | 6/2007 | Ono |
| 2008/0073667 A1 | 3/2008 | Lochtefeld |
| 2008/0265321 A1 | 10/2008 | Yu et al. |
| 2009/0001415 A1 | 1/2009 | Lindert et al. |
| 2009/0026505 A1 | 1/2009 | Okano |
| 2010/0102365 A1 | 4/2010 | Shima |
| 2010/0207209 A1 | 8/2010 | Inokuma |
| 2010/0258870 A1 | 10/2010 | Hsu et al. |
| 2011/0147811 A1 | 6/2011 | Kavalieros et al. |
| 2011/0193178 A1 | 8/2011 | Chang et al. |
| 2011/0309333 A1 | 12/2011 | Cheng et al. |
| 2012/0025312 A1 | 2/2012 | Scheiper et al. |
| 2012/0171832 A1 | 7/2012 | Toh et al. |
| 2012/0177832 A1 | 7/2012 | Fuchs et al. |
| 2012/0261643 A1 | 10/2012 | Cohen et al. |
| 2012/0292707 A1 | 11/2012 | Toh et al. |
| 2013/0062669 A1 | 3/2013 | Chen et al. |
| 2013/0146942 A1 | 6/2013 | Zhu et al. |
| 2013/0200468 A1 | 8/2013 | Cai et al. |
| 2013/0270638 A1 | 10/2013 | Adam et al. |
| 2014/0151746 A1 | 6/2014 | Loubet et al. |
| 2014/0167120 A1* | 6/2014 | Chi ............... H01L 27/0886 257/288 |
| 2014/0175554 A1 | 6/2014 | Loubet et al. |
| 2014/0191321 A1 | 7/2014 | Cheng et al. |
| 2014/0231872 A1 | 8/2014 | Colinge et al. |
| 2014/0235043 A1 | 8/2014 | Lin et al. |
| 2014/0252413 A1 | 9/2014 | Utomo et al. |
| 2014/0264594 A1 | 9/2014 | Adam et al. |
| 2014/0264598 A1 | 9/2014 | Cheng et al. |
| 2014/0299934 A1 | 10/2014 | Kim et al. |
| 2014/0346607 A1 | 11/2014 | Ching et al. |
| 2014/0374839 A1 | 12/2014 | He et al. |
| 2015/0028349 A1 | 1/2015 | Loubet et al. |
| 2015/0034941 A1 | 2/2015 | Hargrove et al. |
| 2015/0041898 A1 | 2/2015 | Loubet et al. |
| 2015/0076514 A1 | 3/2015 | Morin et al. |
| 2015/0140760 A1 | 5/2015 | Loubet et al. |
| 2015/0221769 A1 | 8/2015 | Zhu et al. |
| 2015/0303282 A1 | 10/2015 | Morin et al. |
| 2015/0340290 A1 | 11/2015 | Zhu |
| 2016/0172497 A1 | 6/2016 | Loubet et al. |

* cited by examiner

STRAINED-CHANNEL FIN FETS

BACKGROUND

Technical Field

The technology relates to methods to induce strain in three-dimensional microfabricated structures. As an example, a type of strain (compressive or tensile) and amount of strain can be selectively induced in finFET channel structures.

Discussion of the Related Art

Transistors are fundamental device elements of modern digital processors and memory devices, and have found numerous applications in various areas of electronics, including power electronics. Currently, there are a variety of transistor designs or types that may be used for different applications. Various transistor types include, for example, bipolar junction transistors (BJT), junction field-effect transistors (JFET), metal-oxide-semiconductor field-effect transistors (MOSFET), vertical channel or trench field-effect transistors, and superjunction or multi-drain transistors. One type of transistor that has emerged within the MOSFET family of transistors is a fin field-effect transistor (finFET).

An example of a finFET 100 is depicted in the perspective view of FIG. 1A. A finFET may be fabricated on a bulk semiconductor substrate 110, e.g., a silicon substrate, and comprise a fin-like structure 115 that runs in a length direction along a surface of the substrate and extends in a height direction normal to the substrate surface. The fin 115 may have a narrow width, e.g., less than 250 nanometers. There may be an insulating layer 105, e.g., an oxide layer, on a surface of the substrate. The fin may pass through the insulating layer 105, but be attached to the semiconducting substrate 110 at a lower region of the fin. A gate structure comprising a conductive gate material 130 (e.g., polysilicon) and gate insulator 135 (e.g., an oxide) may be formed over a region of the fin. Upper portions of the fin may be doped on either side of the gate structure to form a source region 120 and drain region 140 adjacent to the gate.

FinFETs have favorable electrostatic properties for complimentary MOS scaling to smaller sizes. Because the fin is a three-dimensional structure, the transistor's channel can be formed on three surfaces of the fin, so that the finFET can exhibit a high current switching capability for a given surface area occupied on substrate. Since the channel and device can be raised from the substrate surface, there can be reduced electric field coupling between adjacent devices as compared to conventional planer MOSFETs.

BRIEF SUMMARY

The described technology relates to methods for making strained microstructures, such as strained-channel finFETs, and to related structures. According to some embodiments, a first strain-inducing layer comprising a first material may be deposited on a substrate in a strained state. The strain-inducing layer may comprise SiGe deposited on a Si substrate, in some embodiments. A second layer of material (e.g., Si) may be deposited adjacent the strain-inducing layer, and a feature (e.g., a fin of a finFET) may be patterned in the second layer. The adjacent second layer may be in direct physical contact with the strain-inducing layer in some embodiments, or may be separated from the strain-inducing layer by a thin layer of material in some embodiments. The strain-inducing layer may be cut or etched in the vicinity of the patterned feature to relieve strain in the strain-inducing layer, and to impart strain to the adjacent second layer and its patterned feature. With regard to a finFET structure, the strain-inducing layer may be thin (e.g., between approximately 10 nm and 60 nm in some embodiments) such that strain in the layer is relieved by elastic relaxation rather than plastic relaxation, so that defects are not generated at unacceptable levels.

According to some embodiments, a method for making a strained three-dimensional feature on a substrate comprises forming a first semiconductor layer in a strained state at a surface of a substrate, and forming a second semiconductor layer adjacent the first semiconductor layer. The method may further include patterning the three-dimensional feature in at least the second semiconductor layer, and cutting the first semiconductor layer in the vicinity of the patterned three-dimensional feature to relieve strain in the first semiconductor layer and induce strain in the patterned three-dimensional feature. The cutting may comprise etching the first semiconductor layer, and the patterned feature may be a fin of a finFET.

Structures related to the methods are also contemplated. In some embodiments, a strained-channel finFET structure formed on a substrate using methods described herein comprises a strain-inducing feature adjacent to a fin of the finFET structure, wherein the strain-inducing feature is formed from a first semiconductor material having a first strain. The strained-channel finFET may further comprise the fin formed from a second semiconductor material that is strained by the strain-inducing feature. In some embodiments, the strain-inducing feature is in the shape of the fin, and abuts the fin.

The foregoing and other aspects, embodiments, and features of the present teachings can be more fully understood from the following description in conjunction with the accompanying drawings.

BRIEF DESCRIPTION OF THE SEVERAL VIEWS OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device may be shown of a large plurality of devices that may be fabricated in parallel. The drawings are not intended to limit the scope of the present teachings in any way.

The features and advantages of the embodiments will become more apparent from the detailed description set forth below when taken in conjunction with the drawings.

DETAILED DESCRIPTION

Figure 1A:
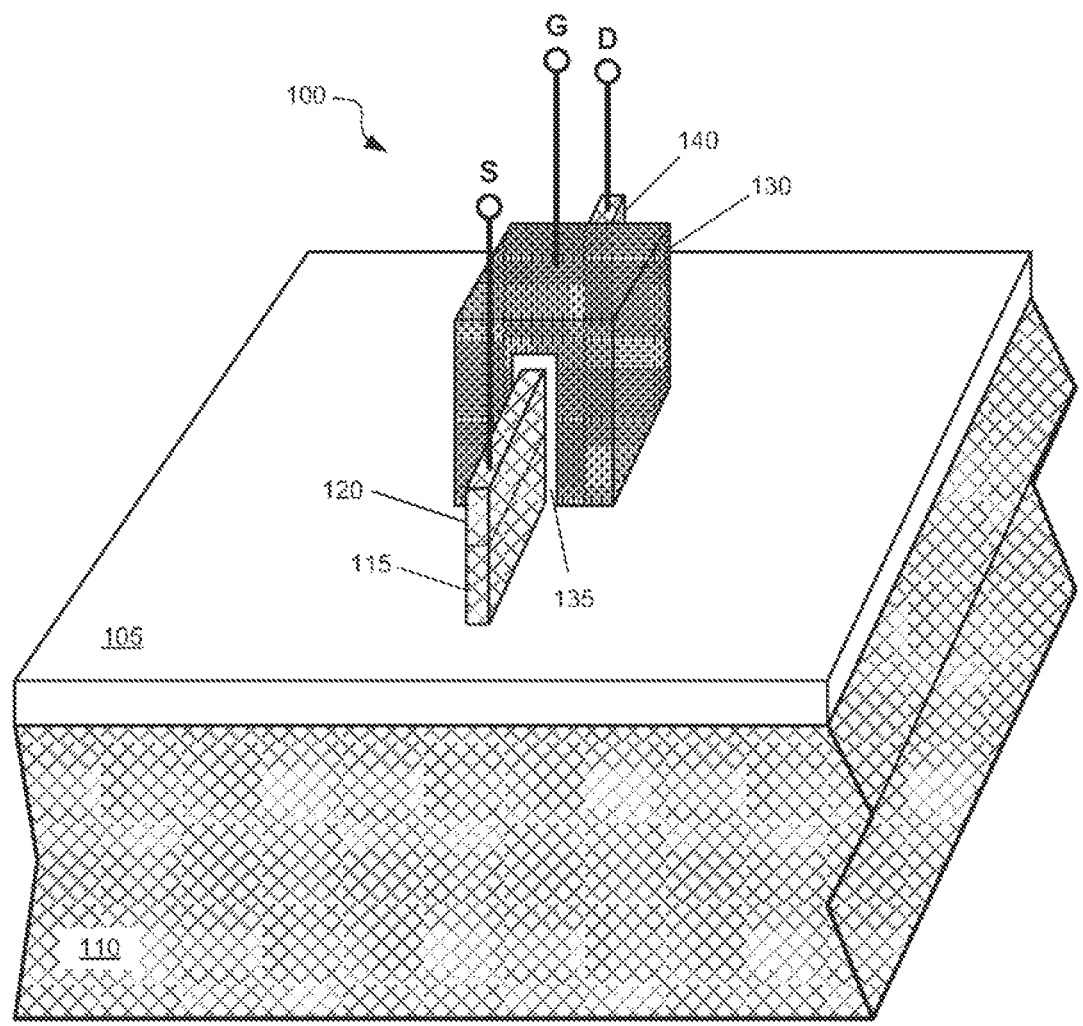
FIG. 1A is a perspective view of a finFET formed on a bulk substrate.

As noted above, finFETs exhibit favorable current-to-size switching capabilities for integrated circuits, and finFETs like those shown in FIG. 1A have been fabricated in high density on bulk silicon (Si) substrates. FinFETs also exhibit favorable electrostatic properties for scaling to high-density, low-power, integrated circuits. Because the fin and channel are raised from the substrate, the devices can exhibit reduced cross-coupling between proximal devices.

In some cases, speed, junction leakage current, and/or breakdown voltage considerations may create a need for semiconductor material other than silicon. For example, SiGe can exhibit higher mobilities for electrons and holes, higher device speed, and lower junction leakage than bulk Si. As a result, some devices may be fabricated from SiGe that is epitaxially grown on a silicon substrate. However, conventional epitaxial growth of SiGe for forming integrated devices has some attributes that may not be favorable for certain applications. For example, because of a lattice constant mismatch between SiGe and Si, strain is induced in the SiGe as it is epitaxially grown. In some cases, the strain causes dislocations or defects in the SiGe during its growth, which can adversely affect device performance to unacceptable levels. To mitigate effects of strain, a thick epitaxial layer of SiGe may be grown so that the strain is relieved over an appreciable distance. Depending upon the dopant concentration, SiGe epitaxial layers 1-10 microns thick may be necessary, and plastic relaxation may occur in the material causing defects. Such an approach may require long and complex epitaxy steps (e.g., it may be necessary to vary dopant concentration during the epitaxial growth), and may further require a thermal annealing step and chemical-mechanical polishing step to planarize a surface of the SiGe after its growth. The annealing may reduce some defects generated during epitaxial growth of SiGe, but typically the defects may not be reduced below $10^5$ defects/cm$^2$, a level not suitable for many industrial applications.

Straining of silicon can be used to improve some of its electrical properties. For example compressive straining of silicon can improve the hole mobility within silicon. Tensile straining of Si can improve electron mobility. The inventors have recognized and appreciated that inducing strain in silicon can be used to fabricate integrated electronic devices with performance that is competitive with SiGe devices. For smaller devices, e.g., sub-20-nm channel-width FETs such as finFETs, the avoidance of thick (>1 micron) SiGe epitaxial layers and increased device performance from strain may be important factors in the manufacturability of the strained devices. As an example of inducing strain in an integrated, three-dimensional device, described below are methods for making strained-Si-channel finFET devices. Although the embodiments are directed to a strained-channel Si finFET, the method of inducing strain may be extended to other devices or structures, in which other materials may be used.

Figure 1B:
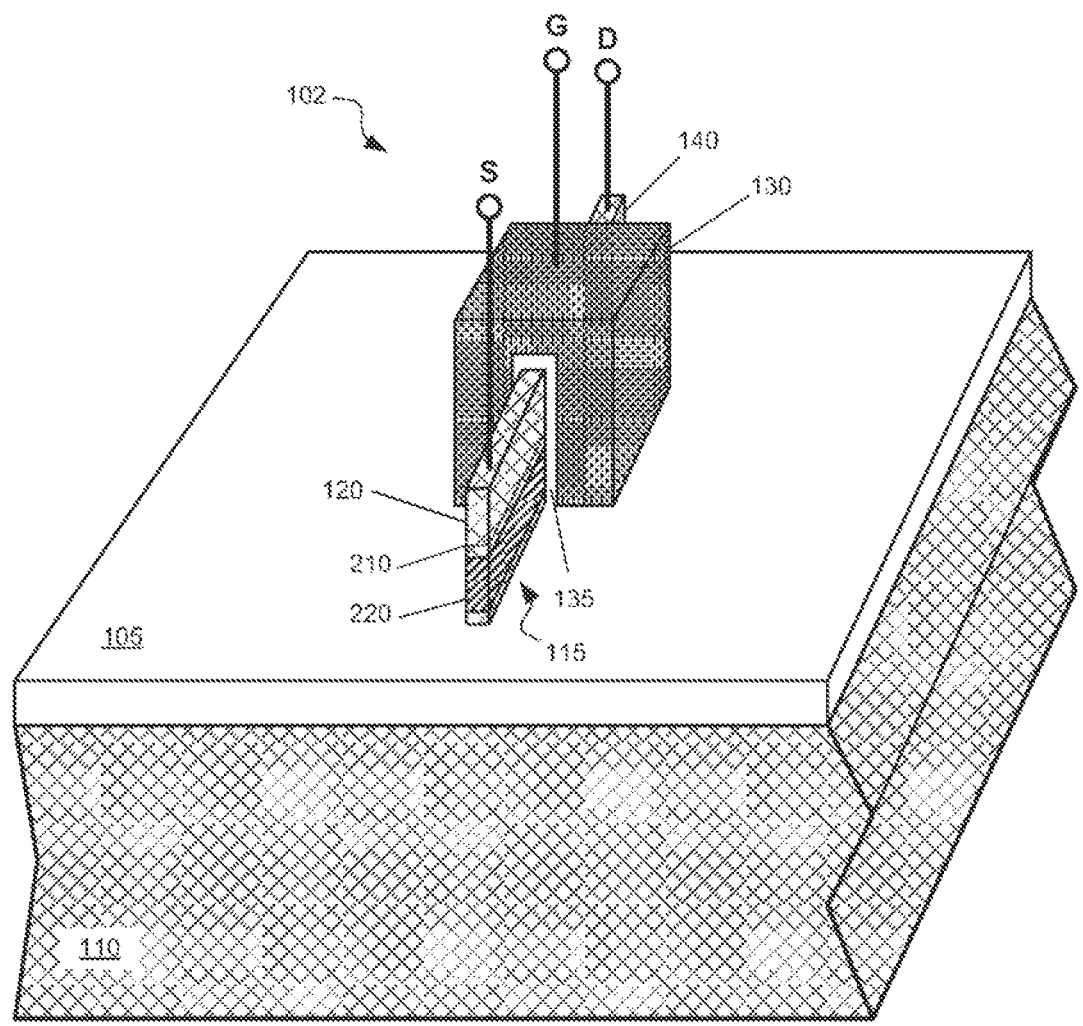
FIG. 1B is a perspective view of a strained-channel finFET, according to some embodiments.

A strained-channel finFET 102 may appear as depicted in FIG. 1B. The structure may be similar to that shown in FIG. 1A except that a portion of the fin structure 115 includes a strain-inducing layer 220. The strain inducing layer may comprise a material or alloy different than the material or alloy of the device layer 210 where the device's active region is located. For example, in a Si-based device, the device layer 210 may be formed from bulk and/or epitaxial silicon. The strain inducing layer 220 may be formed from SiGe in some embodiments (e.g., to induce tensile stress in the fin and improve electron mobility in the device 102), or SiC in other embodiments (e.g., to induce compressive stress in the fin and improve hole mobility in the device. As may be appreciated, other materials exhibiting a lattice mismatch with the substrate and device layer may be used instead of SiGe or SiC, and different material systems may be used in other implementations.

FIGS. 2A-2G depict process steps that may be used to fabricate strained-channel finFET devices beginning with a bulk semiconductor substrate. In overview, the active regions of the fins 115 may be formed from epitaxially-grown semiconductor of high quality (e.g., epitaxial Si in the example). The fins may be epitaxially grown on a thin strain-inducing layer 220 of a second material type, which may be epitaxially grown on a substrate 110. The strain-inducing layer 220, because of a lattice mismatch with the substrate, will epitaxially grow in a strained state. When the fin and underlying straining material are cut via etching, the strain-inducing layer can locally and elastically relax to relieve its strain. This elastic relaxation can impart strain to the adjacent fin. Additionally, since the formation of the strain-inducing layer and relaxation of that layer can be purely elastic, there may be no appreciable defects generated in the strain-inducing layer and/or the device layer, as would be generated from thicker, plastic SiGe layers that may suffer from plastic deformation and relaxation, for example. Further details regarding device fabrication are described below.

Figure 2A:
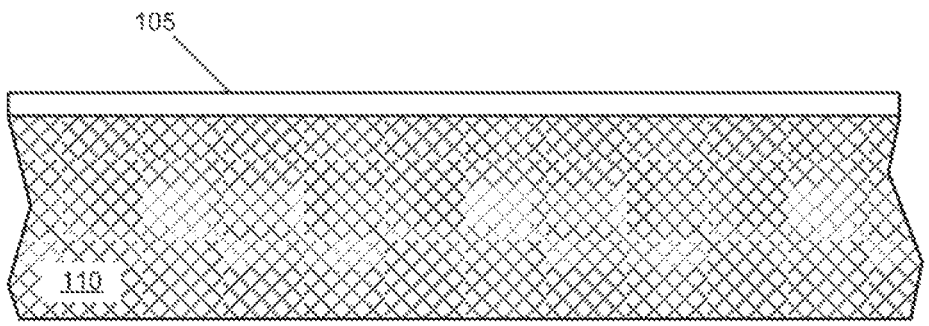
FIGS. 2A-2H depict process steps that may be used to form strained fin structures, e.g., via a sidewall image transfer process, according to some embodiments.

According to some embodiments, a process for forming a strained-channel finFET may begin with a substrate 110 of a first semiconductor material upon which an insulator 105 may be formed, as depicted in FIG. 2A. The insulator may be a pad oxide in some embodiments, and may be formed by a thermal oxidation process or a physical or chemical deposition process. The substrate may be a semiconducting substrate (e.g., a bulk Si substrate), though other semiconducting materials may be used in other embodiments. The insulator may comprise $SiO_2$ or $Si_3N_4$, though any suitable insulator may be used. The thickness of the insulator may be any value between approximately 5 nanometers (nm) and approximately 2 microns (μm).

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

Figure 2B:
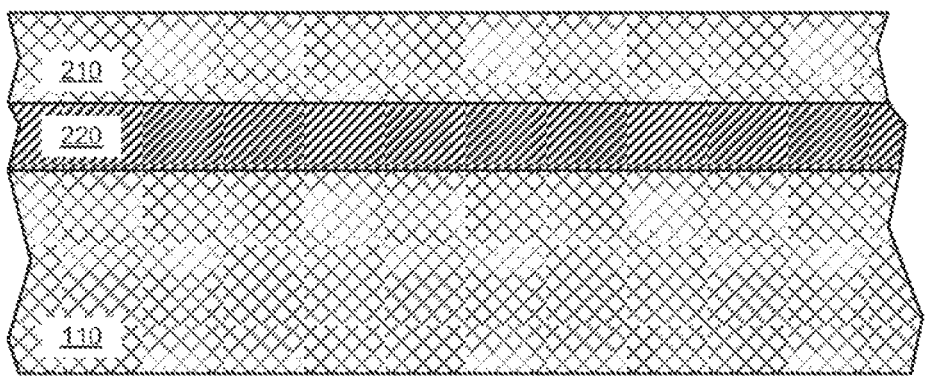

With reference to FIG. 2B, at a region where fins for finFETs are to be formed, the insulator 105 may be removed from the substrate surface (e.g., by a photolithography and etching process) to open wells in the insulator. In some embodiments, the insulator 105 may be removed from the entire surface of the substrate 110. In other embodiments, instead of depositing an insulator 105 and opening wells, a pad or field oxide may be formed around regions that include finFET transistors.

Where the substrate surface is exposed, a second semiconductor material (e.g., SiGe or SiC) may be epitaxially grown over the surface to form a strain-inducing layer 220. Subsequently, a device layer 210 of the first semiconductor material may be epitaxially grown over the second semiconductor material. Because of the epitaxial growth of the strain-inducing layer 220 and the device layer 210, the crystalline quality at the device layer 210 is high. For example, it may have a defect density less than $10^5$ defects/$cm^2$ in some embodiments, less than $10^4$ defects/$cm^2$ in some embodiments, less than $10^3$ defects/$cm^2$ in some embodiments, and yet less than less than $10^2$ defects/$cm^2$ in some embodiments. According to some embodiments, the device layer 210 forms a layer in which fins for strained-channel finFETs may be formed. In some embodiments, the semiconductor material of the device layer 210 may be different than the semiconductor material of the substrate.

The thickness of the device layer 210 may be between 5 nm and 100 nm in some embodiments, between 10 nm and 60 nm in some embodiments, and in some embodiments may between about 15 nm and 30 nm. The thickness of the strain-inducing layer 220 may be between 5 nm and 100 nm in some embodiments, between 10 nm and 60 nm in some embodiments, and in some embodiments may be between 30 nm and 50 nm.

Figure 2C:
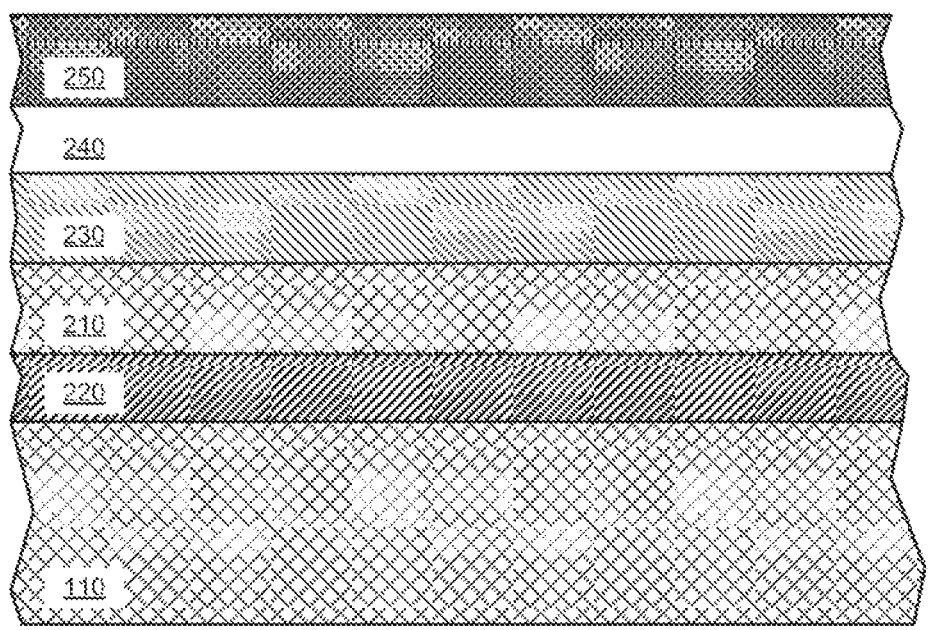

The fins may be patterned by a sidewall image transfer (SIT) process that is depicted by steps illustrated in FIGS. 2C-2F. For this process, additional layers may be deposited over the epitaxial layers, as depicted in FIG. 2C. A hard mask layer 230 may be deposited over the device layer 210. The hard mask layer may comprise silicon nitride (e.g., $Si_3N_4$) in some embodiments, though any suitable hard mask material may be used that exhibits etch selectivity over the underlying semiconductor materials. The thickness of the hard mask material may be between 10 nm and 100 nm in some embodiments, between 20 nm and 50 nm in some embodiments, and in some embodiments may be about 40 nm.

On the hard mask layer 230 an insulating layer 240 may be formed. The insulating layer may comprise undoped silicate glass (USG), and its thickness may be between 10 nm and 100 nm in some embodiments, between 20 nm and 50 nm in some embodiments, and in some embodiments may be about 30 nm. In some embodiments, the insulating layer 240 may be applied by any suitable means, e.g., via physical deposition, a plasma deposition process, or a spin-on and anneal process.

A patterning layer 250 may be deposited over the insulating layer 240. In some embodiments, the patterning layer 250 may comprise amorphous silicon that is deposited by a plasma deposition process, though any suitable material may be used. The patterning layer 250 may be between 10 nm and 100 nm in some embodiments, between 20 nm and 50 nm in some embodiments, and in some embodiments may be about 40 nm.

Figure 2D:
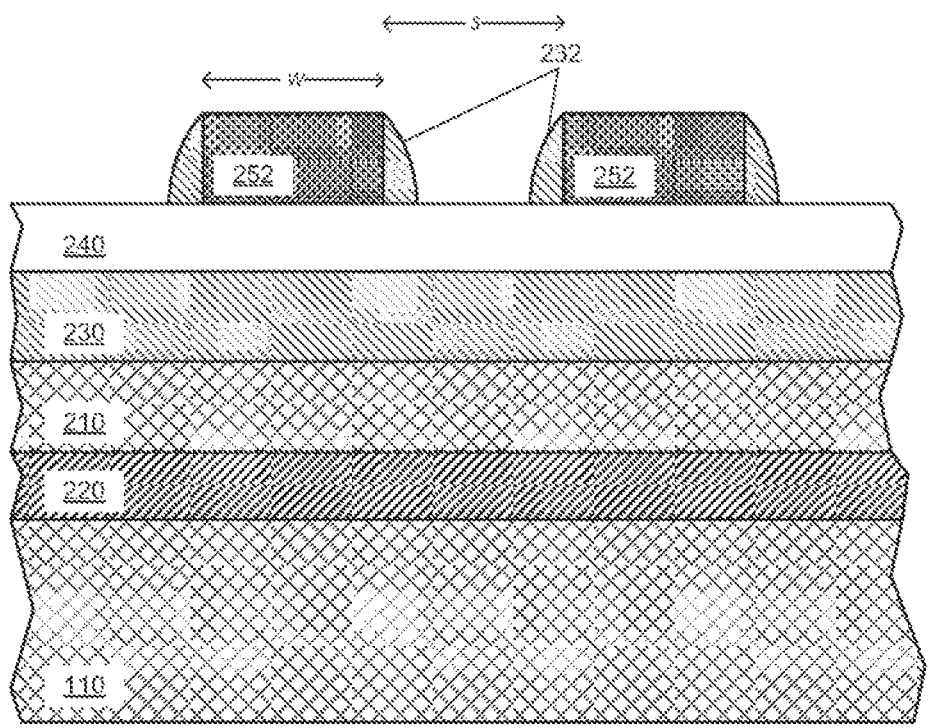

Referring to FIG. 2D, bar-like structures 252 may be patterned in the patterning layer 250 using any suitable method, e.g., photolithography and etching. The photolithography may require forming a photoresist layer over the patterning layer 250, exposing and developing the photoresist, and etching the patterning layer. In some embodiments, the bar-like structures may be patterned using a mandrel lithography process. In some implementations, the bar-like structures may be patterned using interferometric lithography techniques. The bar-like structures 252 may be patterned to extend for a length L (into the page) that is a desired length for a fin of a finFET transistor. The width W and spacing S of the bar-like structures may be chosen to provide desired spacings between multiple fins of a finFET device or between multiple finFET devices.

A blanket masking layer (not shown) may be deposited over the bar-like structures 252 and insulating layer 240. In some embodiments, the blanket masking layer may comprise silicon nitride that is deposited by a plasma deposition process. The thickness of the masking layer may be between 50 nm and 100 nm in some embodiments, between 5 nm and 50 nm in some embodiments, and in some embodiments may be between about 5 nm and about 20 nm. The blanket masking layer may be etched away to form spacer structures 232, as depicted in FIG. 2D. A series of etching steps may then be used to pattern fins in the first semiconductor layer 210, where the spacer structures 232 define the pattern of the fins.

Figure 2E:
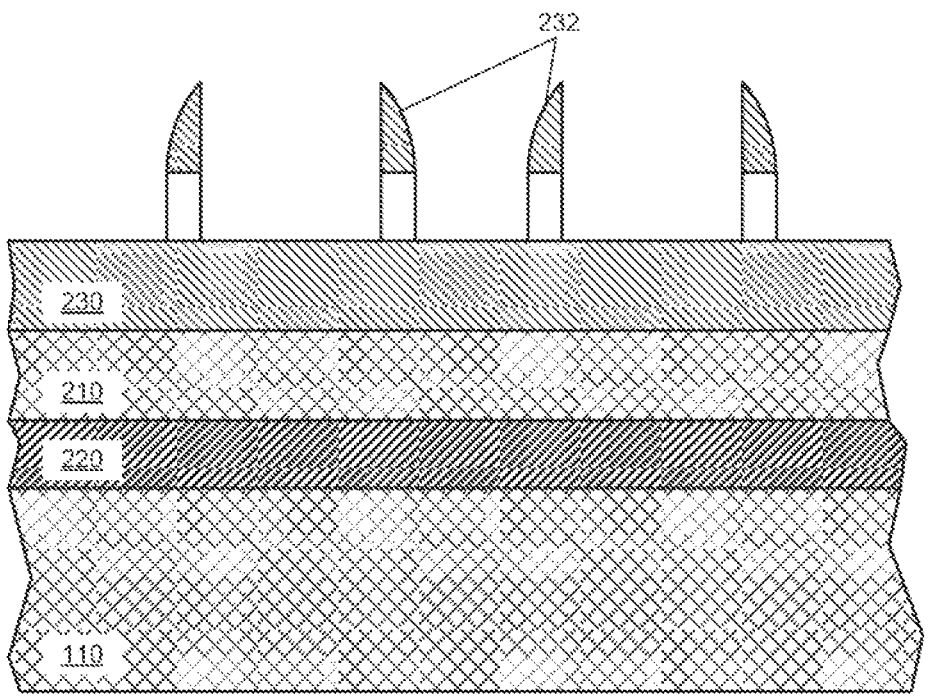
Figure 2F:
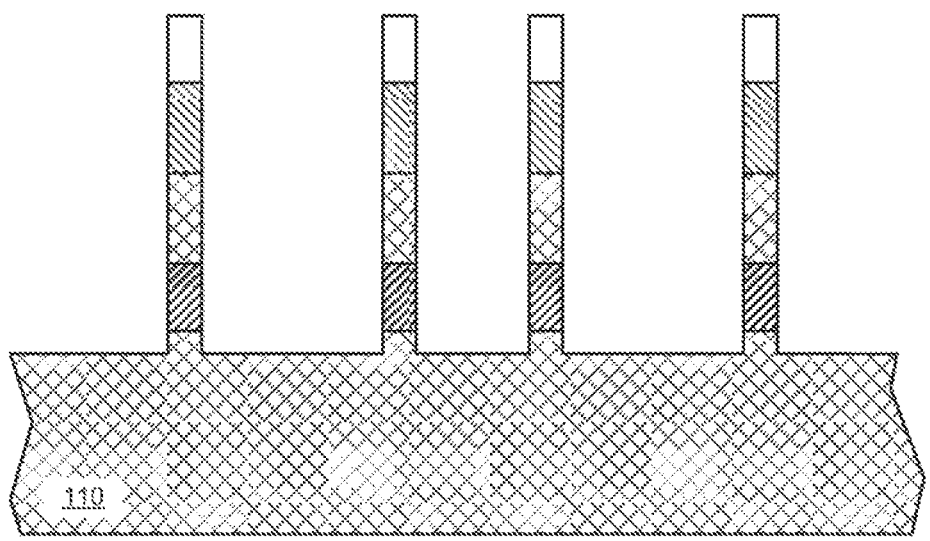
Figure 2G:
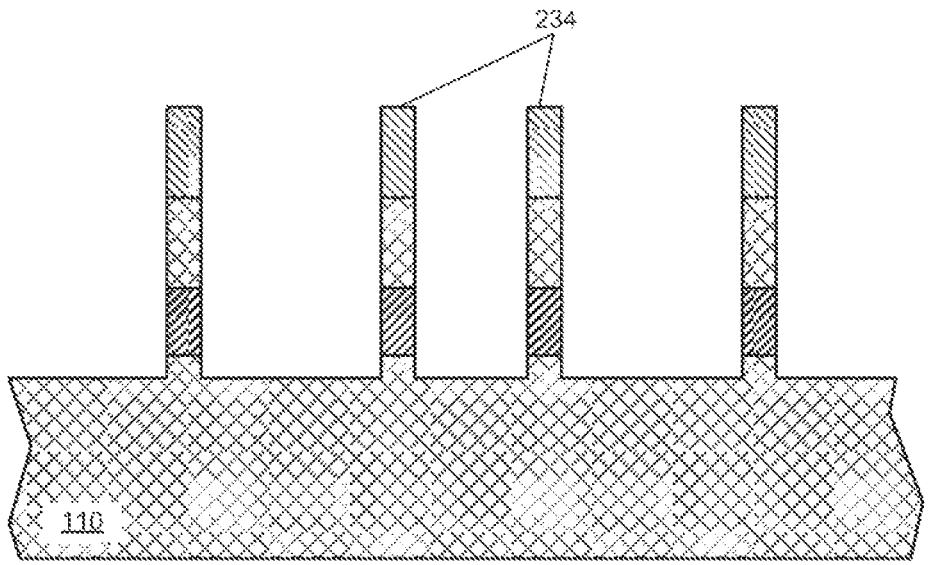
Figure 2H:
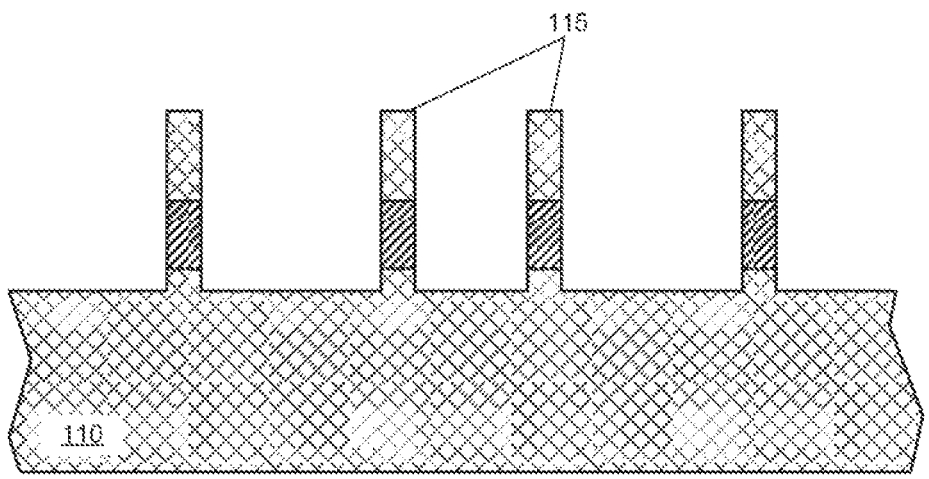

For example, a first selective, anisotropic etch may be performed to remove the bar-like structures 252. The same etch recipe, or a different etch recipe may be used to remove most of the insulating layer 240, thereby transferring the pattern of the spacer structures 232 to the insulating layer. The resulting structure may appear as depicted in FIG. 2E. A second selective, anisotropic etch may be performed to remove portions of the hard mask layer 230, thereby transferring the pattern from the insulating layer to the hard mask layer 230. If the hard mask layer 230 and spacer structures 232 are formed of the same material, most or all of the spacer structures may be removed during the etch, and the patterned insulator serves as an etch mask for the hard mask layer 230. Additional selective, anisotropic etches may be performed to transfer the pattern from the hard mask layer to the underlying device layer 210 and strain-inducing layer 220. The resulting structure may be as depicted in FIG. 2F. In some embodiments, the additional etching may proceed into the substrate 110 between 5 nm and 50 nm. In some implementations, the additional etching may stop at approximately the surface of the substrate 110. The upper insulating material 240 may be removed from the substrate (e.g., using a wet or dry etch) leaving exposed hard mask features 234, as depicted in FIG. 2G. The hard mask features 234 may then be removed, e.g., by a wet or dry etch, yielding a structure as depicted in FIG. 2H.

As noted above, the strain-inducing layer 220 forms in a strained state during its epitaxial growth due to a lattice mismatch between the material used for the strain-inducing layer and the substrate. As an example, a SiGe strain-inducing layer will form with compressive strain when grown on a bulk Si substrate. The amount of strain in the SiGe layer can be controlled to some extent by controlling the Si:Ge ratio. The combination of etching the fin structures 115 through the strain-inducing layer and removing the hard mask feature 234 allows the strain-inducing material to relax locally at each fin and relieve some of its strain. In doing so, the strain-inducing layer imparts strain (tensile in this case) to the adjacent fin formed in the device layer 210 where the channel of a finFET will be formed. Because of the narrow and long fin structures, the resulting strain in the device fins will be substantially uniaxial, longitudinal strain along the length of the fin. According to some embodiments, relaxation of the strain-inducing layer may be purely elastic, such that no appreciable defects are generated.

To investigate the induced strain imparted to the fin, numerical simulations based on finite element analysis were carried out. These computations show that the amount of strain in the device fin and its uniformity can be controlled through several device design parameters. Among the controlling parameters are lattice mismatch between the strain-inducing layer and substrate (controllable through choice of materials and/or dopant concentrations), thickness or height of the strain-inducing layer, thickness or height of the fin, and length of the fin.

Figure 3:
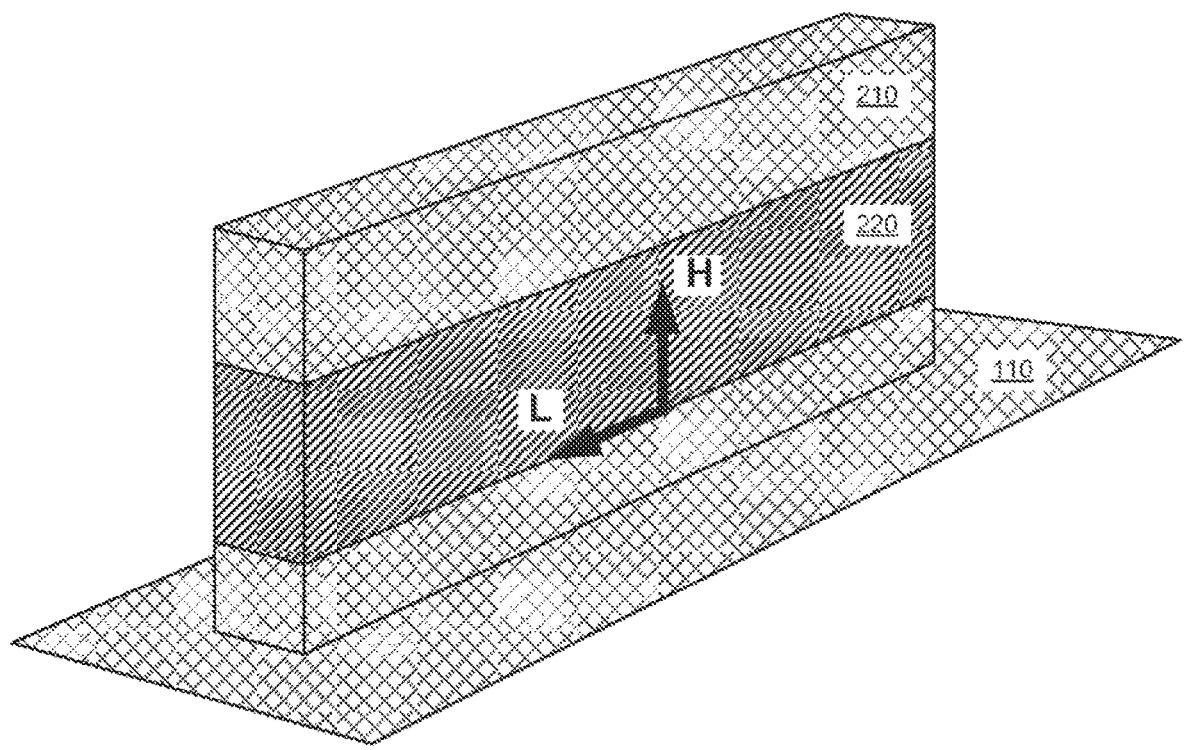
FIG. 3 is a perspective view of a strained fin structure, according to some embodiments.

FIG. 3 shows a perspective view of a fin structure in which longitudinal stress was numerically analyzed. The longitudinal stress $S_{yy}$ was computed along a length L of the fin from its center, and along a height H at the fin center. According to some embodiments, an active region or channel of a finFET would be located at the center of the fin structure in the upper device layer 210. Two sets of simulations were run. In both sets, the thickness or height of the strain-inducing layer 220 was selected to be 40 nm, and the concentration of Ge in the SiGe strain-inducing layer was about 25%. In the first set of simulations, the thickness of the device layer and active fin was selected to be 20 nm. In the second set of simulations, the thickness of the active fin was selected to be 30 nm. Eight fin lengths were trialed in the first set of simulations: 80 nm, 120 nm, 140 nm, 160 nm, 180 nm, 200 nm, 220 nm, and 240 nm. Nine fin lengths were trialed in the second set of simulations: 100 nm, 120 nm, 160 nm, 180 nm, 200 nm, 220 nm, 240 nm, 260 nm, and 300 nm. Results from the simulations are shown in FIGS. 4A-4F.

Figure 4A:
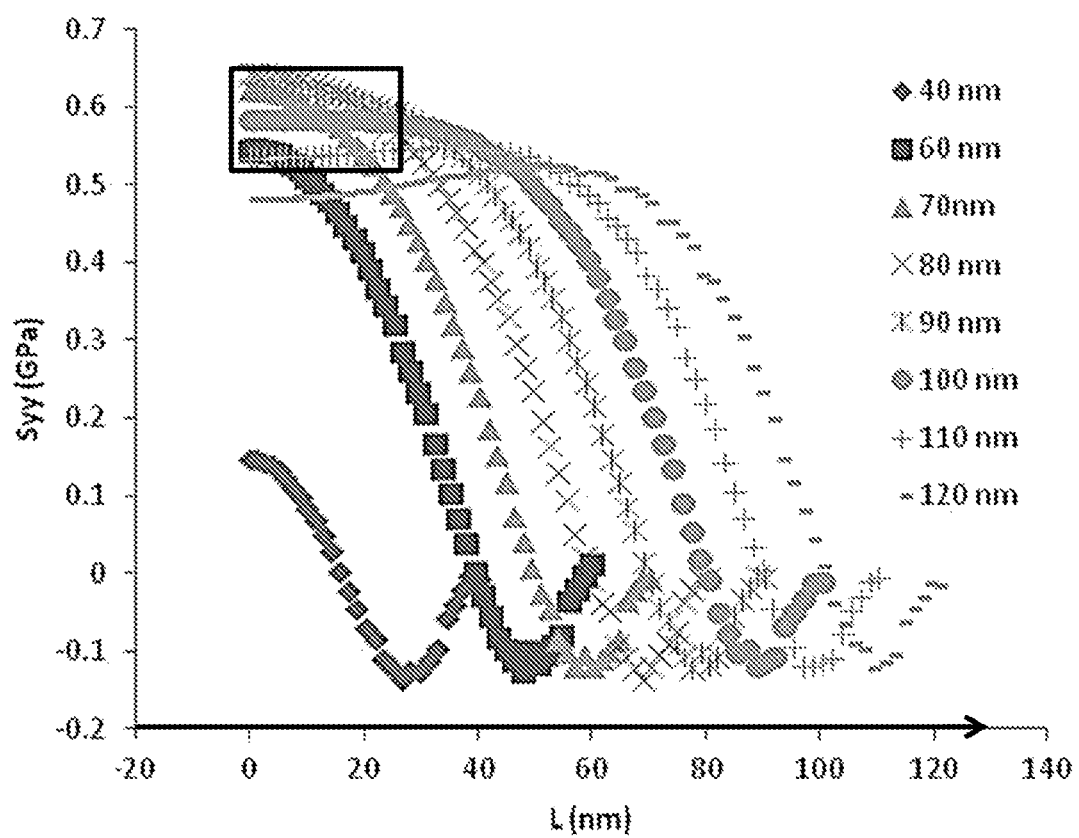
FIG. 4A shows plots of longitudinal stress computed along the length of a strained fin structure, starting from the fin's center, for eight fin lengths, wherein the strain-inducing layer has a thickness of 40 nm, and the fin layer has a thickness of 20 nm.

FIG. 4A plots longitudinal stress values $S_{yy}$ (in gigaPascals) as computed along a length of the active fin (starting from the center (L=0 nm) and top (H=60 nm) of the fin structure) for the eight different fin lengths. The results show a tensile stress at the fin center that falls to zero. The stress reverses to compressive stress, and then falls to zero again within about 20 nm from the end of the fins. For the materials (Si/SiGe), dopant concentration (25% Ge), strain-inducing layer thickness (40 nm), device layer thickness (20 nm) and channel lengths trialed, the maximal stress was found to be about (600±50) MPa for fin lengths between about 120 nm and about 220 nm. These results indicate that there is a preferred length range of the fin for obtaining a high value of stress in the channel region. Increasing the fin length beyond this point, even though adding more strained material to the fin structure, can actually reduce the induced stress at the center of the fin.

Figure 4B:
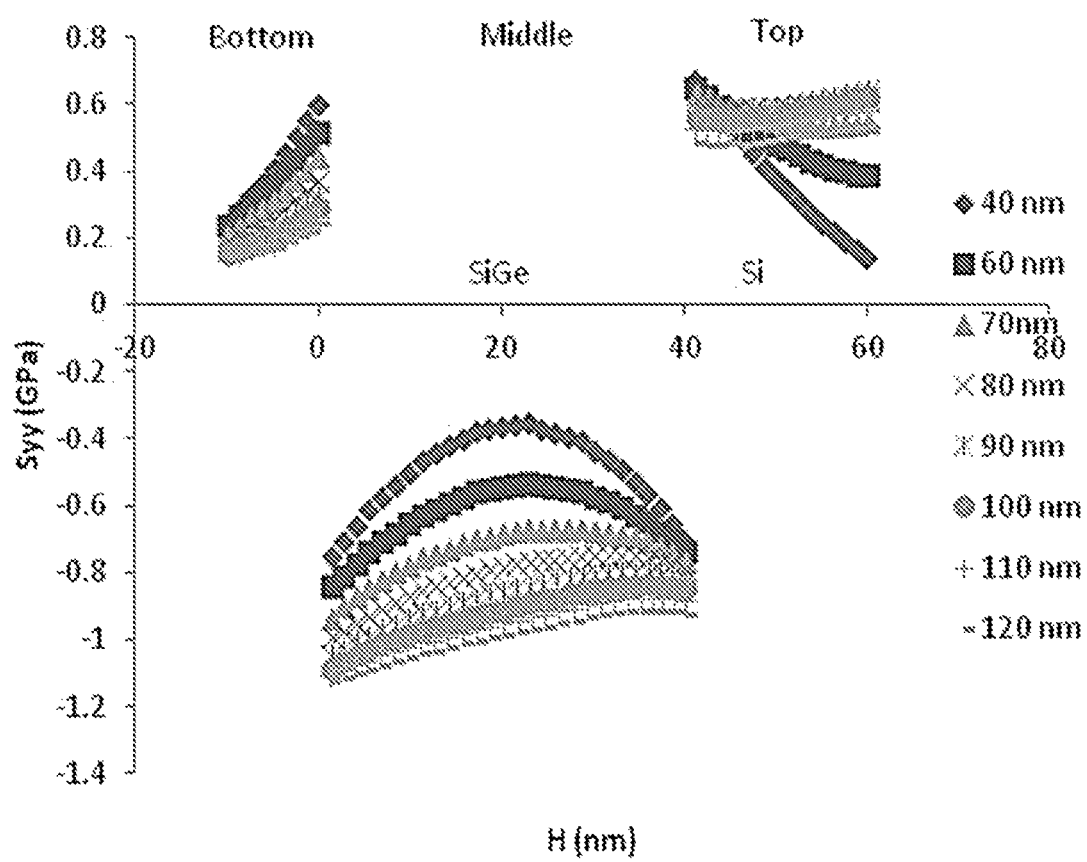
FIGS. 4B-4C show plots of longitudinal stress computed along the height of a strained fin structure, at its center, for the eight fin lengths and conditions of FIG. 4A.
Figure 4C:
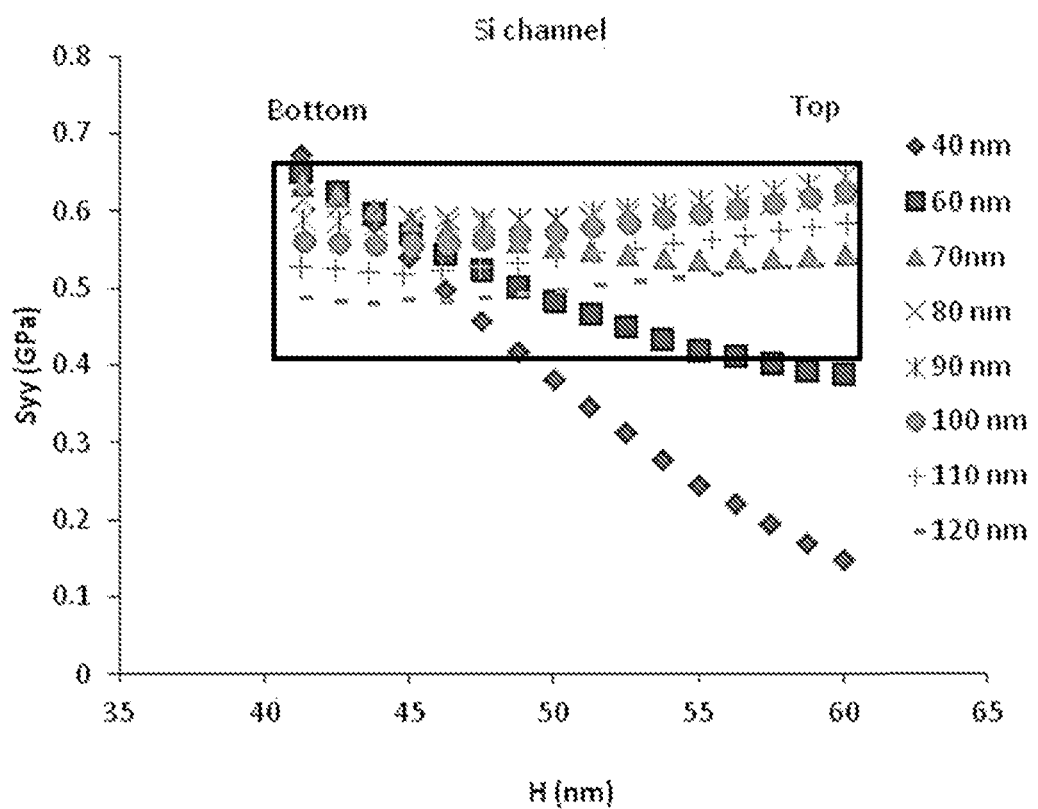

FIGS. 4B-4C plot longitudinal stress values $S_{yy}$ (in gigaPascals) as computed along a height of the fin structure (starting at the center (L=0 nm) from a lower surface (H=0 nm) of the strain-inducing layer) for the eight different fin lengths. FIG. 4B shows the stress variations with height from 10 nm into the substrate 110, through the strain-inducing layer 220, and through the device layer 210. This plot indicates that compressive stress in the strain-inducing (SiGe) layer induces tensile stress in the adjacent materials. FIG. 4C is a replot of the longitudinal stress in the active fin portion of FIG. 4B (from H=40 nm to H=60 nm). The results of FIG. 4C indicate that the longitudinal stress is substantially uniform along the active fin height for a range of fin length values. Interestingly, the range of length values for uniformity of stress as a function of height substantially coincides with a range of fin length values where the induced longitudinal stress is maximized at the center of the fin. (Compare with FIG. 4A.) According to some embodiments, the observed uniformity of stress values as a function of height substantially coincides with a range of fin length values where the induced longitudinal stress is improved at the center of the fin. Such results are beneficial for a finFET where the gate may extend from the bottom of the fin to its top. The results of FIGS. 4A-4C suggest that for the selected parameters, a fin length in a range of about 160 nm to about 180 nm provides increased stress in the finFET's channel region and high uniformity of stress as a function of height in the channel region.

Figure 4D:
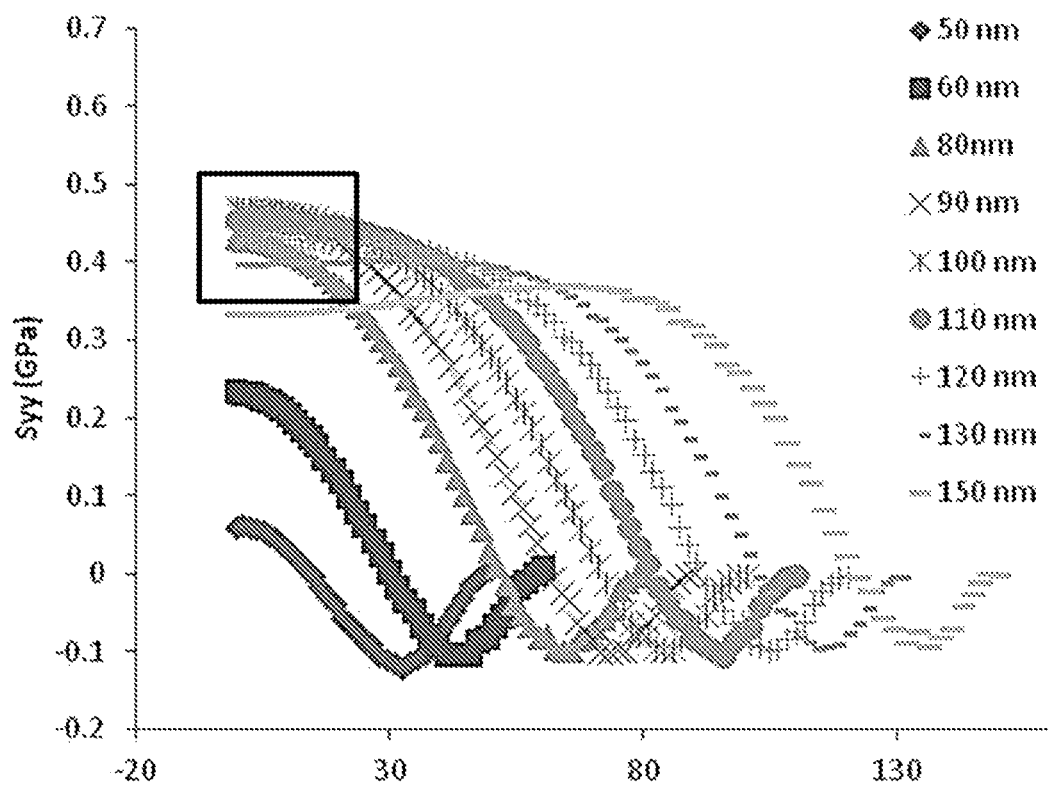
FIG. 4D shows plots of longitudinal stress computed along the length of a strained fin structure, starting from the fin's center, for nine fin lengths wherein the strain-inducing layer has a thickness of 40 nm, and the fin layer has a thickness of 30 nm.
Figure 4E:
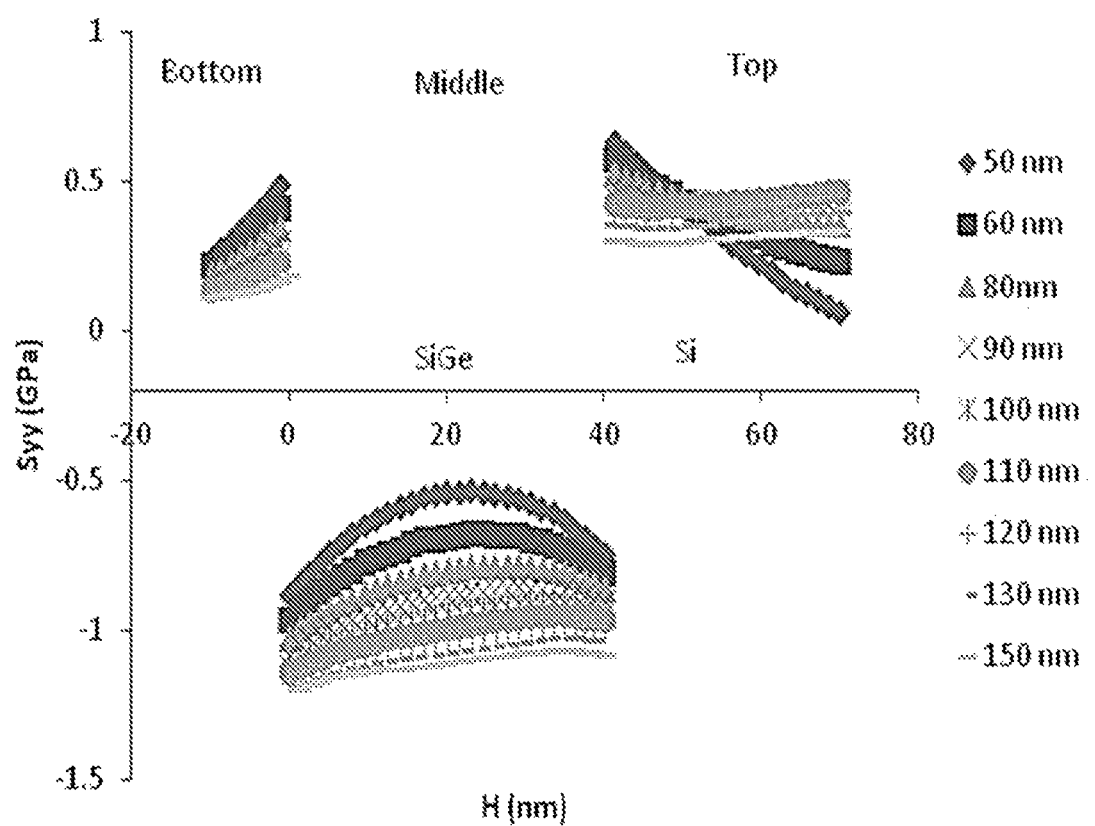
FIGS. 4E-4F show plots of longitudinal stress computed along the height of a strained fin structure, at its center, for the nine fin lengths and conditions of FIG. 4D.
Figure 4F:
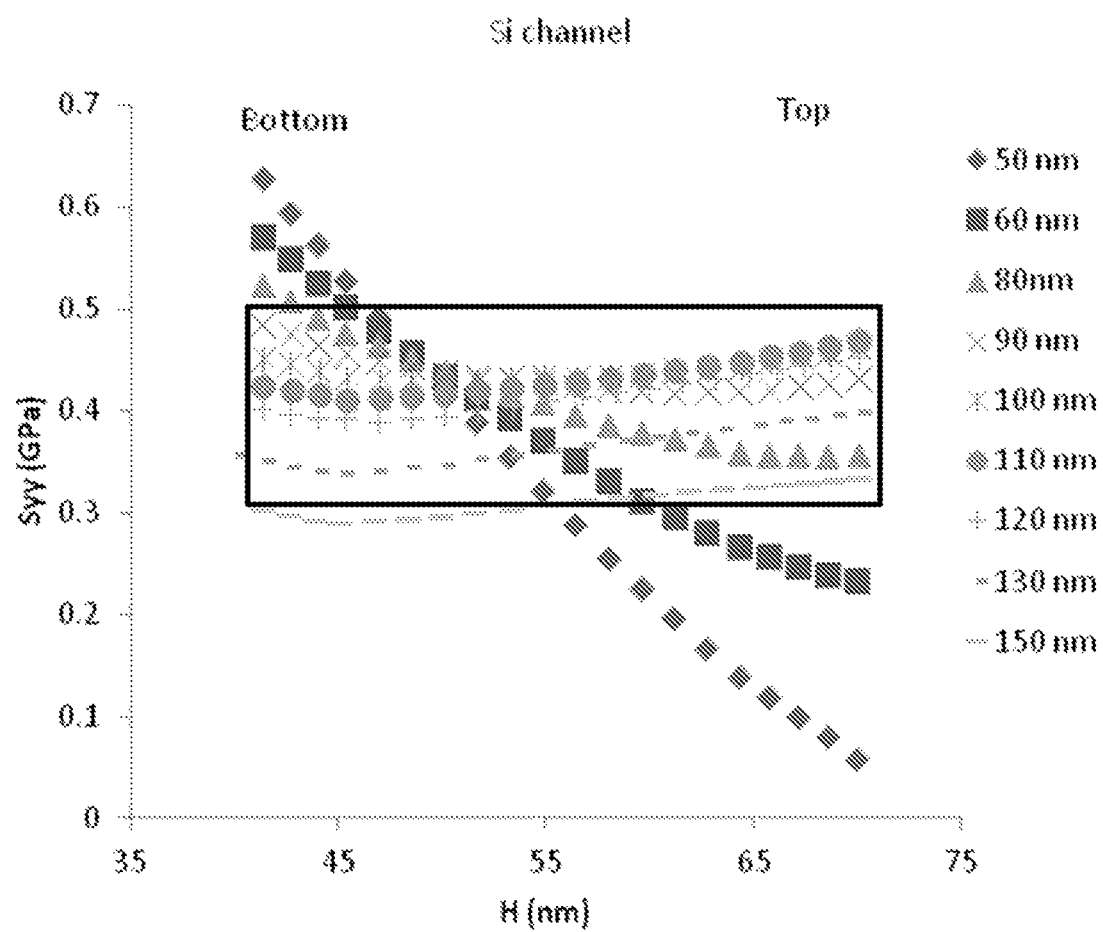

FIGS. 4D-4F show results for the second set of simulations in which the active fin height was set at 30 nm. This second set of results suggest that for the selected parameters, a fin length in a range of about 180 nm to about 220 nm provides increased stress in the finFET's channel region and high uniformity of stress as a function of height in the channel region.

Based upon the results of FIGS. 4A-4F, a dimensionless design parameter $R_{sc}$ can be defined for strained-channel finFETs fabricated according to embodiments described above:

$$R_{sc} = \frac{L}{T_{si} + T_f} \qquad (1)$$

where L represents the fin length, $T_{si}$ represents the thickness of the strain-inducing layer, and $T_f$ represents the thickness of the device layer. According to some embodiments, a design parameter $R_{sc}$ for strained-channel finFETs may be within a range given approximately by $2.55 \leq R_{sc} \leq 3.12$. According to some embodiments, a design parameter $R_{sc}$ for strained-channel finFETs may be within a range given approximately by $2.65 \leq R_{sc} \leq 3.03$.

The results shown in FIGS. 4A-4F were obtained from samples with uniform doping (25% Ge) in the strain-inducing layer 220 of 40 nm thickness. In some embodiments, it may be possible to increase the Ge content (or C content for a SiC strain inducing layer) and/or increase the thickness of the strain-inducing layer before creating an unacceptable defect density. In some embodiments, a gradient in Ge (or C) content may be used to increase the thickness of the strain-inducing layer without creating an unacceptable defect density. The gradient in Ge (or C) may be in the direction of epitaxial growth, e.g., in a direction perpendicular to an interfacial surface between the strain-inducing layer 220 and the strained or device layer 210. In some embodiments, the Ge (or C) content may be between about 10% and about 25% within the strain-inducing layer. In some embodiments, the Ge (or C) content may be between about 25% and about 40% within the strain-inducing layer.

The fins shown in the drawings may be spaced laterally from each other on one or more regular spacing intervals. For example, there may be a uniform lateral spacing $d_1$ between all fins. Alternatively, there may be two uniform lateral spacings $d_1$, $d_2$ alternating between successive fins. The fins may have a width between approximately 5 nm and approximately 30 nm. The fins may be spaced apart between approximately 10 nm and approximately 50 nm, in some embodiments. There may be one or more fins per finFET device. A gate structure, like that shown in FIG. 1B may be formed over one or more strained fins to form a finFET. For example, there may be a common gate shared by multiple strained fins.

A finFET device fabricated according to the present teachings may be formed in an integrated circuit in large numbers and/or at high densities. The circuits may be used for various low-power applications, including but not limited to, circuits for operating smart phones, computers, tablets, PDA's, video displays, and other consumer electronics. For example, a plurality of finFETs fabricated in accordance with the disclosed embodiments may be incorporated in processor or control circuitry used to operate one of the aforementioned devices.

The discussion above is directed primarily to a SiGe strain-inducing layer that imparts tensile stress to a fin of a finFET device. Accordingly, for a Si finFET, the use of SiGe for the strain-inducing layer may improve the electron mobility for n-channel finFETs. For p-channel finFETs, SiC may be used as the strain-inducing layer. SiC can impart compressive stress to a fin. In alternative embodiments for which an active fin and channel may be formed in SiGe, the materials may be reversed. For example, Si may be epitaxially grown on a SiGe substrate or base layer to form a strain-inducing layer of Si. The device layer may then be SiGe.

In alternative embodiments, the cutting of the strain-inducing layer need not be at the same time and/or of the same shape as the patterning of the adjacent device layer. In the above example of a strained-channel finFET, a device may be patterned in the device layer 210 in a first step. At later time, the strain-inducing layer 220 may be etched in the vicinity of the device fin, so as to cut the strain-inducing layer and induce strain in the device fin. The etched pattern in the strain-inducing layer may be different from the pattern used to etch the device fin.

The techniques may be applied to other types of finFETs, e.g., fully insulated finFETs, and other microfabricated devices and structures such as MEMs devices. In some embodiments, the techniques may be used in LEDs or laser diodes to strain the device and adjust emission wavelength. According to some embodiments, a strain-inducing layer may be used to impart stress to any three-dimensional structure patterned into a device layer that has been formed adjacent the strain-inducing layer. For example, a three-dimensional device or structure may be patterned in the device layer, and the strain-inducing layer may be cut (e.g., etched) in the vicinity of the patterned device or structure to relieve strain in the strain-inducing layer and impart strain to the adjacent patterned feature.

In some embodiments, the strain-inducing layer and/or adjacent device layer may comprise a material other than semiconductor material, e.g., crystalline insulator, an oxide, a ceramic, etc. In some embodiments, the strain-inducing layer and/or device layer may be formed by methods other than epitaxial growth, e.g., plasma deposition, plasma deposition and annealing, sputtering, etc. According to some embodiments, a thin insulating layer may be formed between the strain-inducing layer and the device layer where the fin is formed. In some embodiments, at least a portion of the strain-inducing layer may comprise an active region or portion of the formed device.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

We claim:

1. A device, comprising:
 a first device including:
  a first fin structure including a first plurality of layers, the first plurality of layers including a silicon germanium layer having a gradient in germanium content and a first semiconductor layer that is different from the silicon germanium layer; and
  a first gate structure overlapping side surfaces of both the silicon germanium layer and the first semiconductor layer.

2. The device of claim 1 wherein the silicon germanium layer includes a compressive stress and is a strain inducing layer.

3. The device of claim 2, comprising:
 a second device, the second device including:
  a second fin structure including a second plurality of layers, the second plurality of layers including a silicon carbide layer and a second semiconductor layer, the silicon carbide layer including a tensile stress; and
  a second gate structure adjacent to the second semiconductor layer, wherein the second device is a p-channel device and the first device is an n-channel device.

4. The device of claim 1 wherein the silicon germanium layer includes a germanium content in the range of 10% and 40%.

5. The device of claim 4 wherein the first fin structure includes a width in the range of 5 and 30 nanometers.

6. A device, comprising:
 a first fin structure that includes:
  a silicon germanium layer that includes a germanium content in the range of 10% and 40%;
  a first semiconductor layer that is different from the silicon germanium layer; and
 a second fin structure that includes:
  a second semiconductor layer; and
  a third semiconductor layer;
 a common gate overlapping side surfaces of the first and the second fin structure.

7. The device of claim 6 wherein the second semiconductor layer includes germanium.

8. The device of claim 6 wherein the common gate overlaps side surfaces of the silicon germanium layer and the first semiconductor.

9. The device of claim 8 wherein the common gate overlaps side surfaces of the second semiconductor layer and the third semiconductor layer.

10. The device of claim 6 wherein the first fin structure includes a width in the range of 5 and 30 nanometers.

11. A device, comprising:
 a first fin having a first semiconductor layer and a second semiconductor layer;
 a second fin spaced from the first fin by a first dimension, the second fin having a third semiconductor layer and a fourth semiconductor layer;

a third fin is spaced from the second fin by a second dimension that is different from the first dimension, the first semiconductor layer includes silicon germanium and the second semiconductor layer includes silicon.

12. The device of claim 11 wherein a fourth fin is spaced from the third one-fin by the first dimension.

13. The device of claim 11 comprising a common gate overlaps the first fin and the second fin.

14. The device of claim 13 wherein the common gate overlaps sides of the first semiconductor layer and the second semiconductor layer.

15. The device of claim 14 wherein the common gate overlaps sides of the third semiconductor layer and the fourth semiconductor layer.

16. A device, comprising:
a first device including:
a first fin structure including a first plurality of layers, the first plurality of layers including a silicon germanium layer having a gradient in germanium content and a first semiconductor layer;
a first gate structure overlapping side surfaces of both the silicon germanium layer and the first semiconductor layer; and
a second fin structure spaced from the first fin by a first dimension;
a third fin structure spaced from the second fin by a second dimension that is different from the first dimension.

17. The device of claim 16 wherein the first semiconductor layer is different from the silicon germanium layer.

18. The device of claim 17 wherein the silicon germanium layer includes a compressive stress and is a strain inducing layer.

* * * * *

UNITED STATES PATENT AND TRADEMARK OFFICE
CERTIFICATE OF CORRECTION

| | | |
|---|---|---|
| PATENT NO. | : 12,211,936 B2 | Page 1 of 1 |
| APPLICATION NO. | : 18/146962 | |
| DATED | : January 28, 2025 | |
| INVENTOR(S) | : Nicolas Loubet et al. | |

It is certified that error appears in the above-identified patent and that said Letters Patent is hereby corrected as shown below:

In the Claims

Column 11, Claim 12, Line 6:
"third one-fin by the" should read: --third fin by the--.

Signed and Sealed this
First Day of April, 2025

Coke Morgan Stewart
*Acting Director of the United States Patent and Trademark Office*